United States Patent
Mehr et al.

(10) Patent No.: US 9,886,530 B2
(45) Date of Patent: Feb. 6, 2018

(54) COMPUTING CAMERA PARAMETERS

(71) Applicant: Dassault Systemés, Velizy Villacoublay (FR)

(72) Inventors: Eloi Mehr, Steinbrunn-le-Haut (FR); Vincent Guitteny, Paris (FR); Mourad Boufarguine, Paris (FR)

(73) Assignee: Dassault Systems, Velizy Villacoublay (FR)

( * ) Notice: Subject to any disclaimer, the term of this patent is extended or adjusted under 35 U.S.C. 154(b) by 629 days.

(21) Appl. No.: 14/541,860

(22) Filed: Nov. 14, 2014

(65) Prior Publication Data
US 2015/0142394 A1    May 21, 2015

(30) Foreign Application Priority Data

Nov. 18, 2013  (EP) ..................... 13306576

(51) Int. Cl.
*G06F 17/50* (2006.01)
*G06T 17/10* (2006.01)
(Continued)

(52) U.S. Cl.
CPC .......... *G06F 17/50* (2013.01); *G06F 17/5004* (2013.01); *G06F 17/5086* (2013.01);
(Continued)

(58) Field of Classification Search
None
See application file for complete search history.

(56) References Cited

U.S. PATENT DOCUMENTS 6,549,201 B1    4/2003  Igarashi et al.
6,654,027 B1   11/2003  Hernandez
(Continued)

FOREIGN PATENT DOCUMENTS

CN    104 794 722    7/2015
CN    105 657 402    6/2016
(Continued)

OTHER PUBLICATIONS

Krizhevsky, Alex, Ilya Sutskever, and Geoffrey E. Hinton. "ImageNet Classification With Deep Convolutional Neural Networks." *Advances in neural information processing systems*. 2012.
(Continued)

*Primary Examiner* — James A Thompson
(74) *Attorney, Agent, or Firm* — Hamilton, Brook, Smith & Reynolds, P.C.

(57) ABSTRACT

The invention notably relates to a computer-implemented method for designing a 3D modeled object representing a real object. The method comprises the steps of providing a 3D representation of the real object, identifying occurrences of a geometric feature at 3D positions of the 3D representation, providing at least one 2D view of the real object, identifying occurrences of a graphic feature at 2D positions of the 2D view, the geometric feature corresponding to the graphic feature, computing camera parameters that minimize a distance between a set of projections of the 3D positions on the 2D view and a set of 2D positions. This provides an improved solution for designing a 3D modeled object representing a real object.

18 Claims, 7 Drawing Sheets

(51) Int. Cl.
- G06T 15/04 (2011.01)
- G06T 17/00 (2006.01)
- G06T 7/80 (2017.01)
- G06T 7/73 (2017.01)

(52) U.S. Cl.
CPC ............ G06T 7/75 (2017.01); G06T 7/80 (2017.01); G06T 15/04 (2013.01); G06T 17/00 (2013.01); G06T 17/10 (2013.01); G06T 2200/04 (2013.01); G06T 2200/08 (2013.01); G06T 2207/10024 (2013.01); G06T 2207/10028 (2013.01); G06T 2207/30244 (2013.01)

(56) References Cited

U.S. PATENT DOCUMENTS

| | | | |
|---|---|---|---|
| 8,570,343 | B2 | 10/2013 | Halstead |
| 2002/0028418 | A1* | 3/2002 | Farag ............... G06T 17/00 433/29 |
| 2002/0172413 | A1 | 11/2002 | Chen |
| 2003/0206165 | A1 | 11/2003 | Hoppe |
| 2005/0033142 | A1 | 2/2005 | Madden |
| 2007/0008312 | A1* | 1/2007 | Zhou ................... G06T 7/80 345/419 |
| 2009/0202160 | A1 | 8/2009 | Kim |
| 2009/0284550 | A1 | 11/2009 | Shimada et al. |
| 2011/0295564 | A1 | 12/2011 | Chazel |
| 2013/0251241 | A1 | 9/2013 | Kunkel |
| 2013/0321403 | A1* | 12/2013 | Piemonte ............ G06T 15/00 345/419 |
| 2014/0064581 | A1* | 3/2014 | Madabhushi ...... G06K 9/6256 382/128 |
| 2014/0267279 | A1* | 9/2014 | Kontkanen .......... G06T 15/04 345/427 |
| 2014/0340489 | A1* | 11/2014 | Medioni ............. G06K 9/46 348/50 |
| 2014/0358496 | A1 | 12/2014 | Rameau et al. |
| 2014/0362091 | A1 | 12/2014 | Bouaziz et al. |
| 2015/0172628 | A1* | 6/2015 | Brown ................ G06T 17/10 348/47 |
| 2015/0213646 | A1 | 7/2015 | Ma et al. |
| 2015/0279118 | A1 | 10/2015 | Dou et al. |
| 2015/0347846 | A1 | 12/2015 | Guzman-Rivera et al. |
| 2016/0127715 | A1 | 5/2016 | Shotton et al. |
| 2016/0171765 | A1 | 6/2016 | Mehr |
| 2017/0193699 | A1 | 7/2017 | Mehr et al. |

FOREIGN PATENT DOCUMENTS

| | | |
|---|---|---|
| EP | 0 822 522 | 2/1998 |
| WO | WO 2011/142734 | 11/2011 |
| WO | WO 2012/048304 | 4/2012 |
| WO | WO 2013/189058 | 12/2013 |
| WO | WO 2016/050290 | 4/2016 |

OTHER PUBLICATIONS

Loper, Matthew M., and Michael J. Black. "OpenDR: An Approximate Differentiable Renderer." *European Conference on Computer Vision*. Springer International Publishing, 2014.
Chen, Yinpeng, Zicheng Liu, and Zhengyou Zhang. "Tensor-Based Human Body Modeling." *Proceedings of the IEEE Conference on Computer Vision and Pattern Recognition*. 2013.
Bălan, Alexandru O., and Michael J. Black. "The Naked Truth: Estimating Body Shape Under Clothing." *European Conference on Computer Vision*. Springer Berlin Heidelberg, 2008.
Bălan, Alexandra O., et al. "Detailed Human Shape and Pose From Images." *2007 IEEE Conference on Computer Vision and Pattern Recognition*. IEEE, 2007.
Guan, Peng, et al. "Estimating Human Shape and Pose From a Single Image." *2009 IEEE 12th International Conference on Computer Vision*. IEEE, 2009.
Weiss, Alexander, David Hirshberg, and Michael J. Black. "Home 3D Body Scans From Noisy Image and Range Data." *2011 International Conference on Computer Vision*. IEEE, 2011.
Perbet, Frank, et al. "Human Body Shape Estimation Using a Multi-Resolution Manifold Forest." *Proceedings of the IEEE Conference on Computer Vision and Pattern Recognition*. 2014.
Zeng, M., et al. "Dynamic Human Surface Reconstruction Using a Single Kinect", 13$^{th}$ International Conference on Computer-Aided Design and Computer Graphics, 2013.
Leizea, I., et al. "Real-time Deformation, Registration and Tracking of Solids Based on Physical Simulation", IEEE International Symposium on Mixed and Augmented Reality, Science and Technology Proceedings, Sep. 10-12, 2014.
Zollhöfer, M., et al. "Real-time Non-rigid Reconstruction using an RGB-D Camera", ACM Transactions on Graphics, vol. 22, No. 4, Article 156, Jul. 2014.
Leizea, I., et al., "Development and Improvement of Optical Tracking Methods towards Registering the Deformations of 3D Non-Rigid Bodies in Real Time for Augmented Reality Applications", Ph.D. Thesis, pp. 1-314, Feb. 2015.
EP Search Report for EP 15 30 7199 dated Jun. 17, 2016. "Reconstructing a 3D Modeled Object".
Gschwandtner, M., et al., "BlenSor: Blender Sensor Simulation Toolbox", Advances in Visual Computing: 7$^{th}$ International Symposium, vol. 6939/2011 pp. 199-208, 2011.
Nguyen, C., et al., "Modeling Kinect Sensor Noise for Improved 3D Reconstruction and Tracking", 2012 Second Joint 3DIM/3DPVT Conference: 3D Imaging, Modeling, Processing, Visualization & Transmission, IEEE, 2012.
Chatterjee, A., et al., "Noise in Structured-Light Stereo Depth Cameras: Modeling and its Applications", Dept. of Engineering, Indian Institute of Science, Bengaluru, May 8, 2015.
Belhedi, A., "et al.", Noise Modelling and Uncertainty Propagation for TOF Sensors, International Conference of Computer Vision, 2012.
European Search Report for EP 16 18 8268 dated Feb. 21, 2017.
Handa, A., et al., "A Benchmark for RGB-D Visual Odometry, 3D Reconstruction and SLAM", 2014 IEEE International Conference on Robotics and Automation (ICRA), IEEE, pp. 1524-1531, May 31, 2014.
Handa, A., et al., "Understanding Real World Indoor Scenes with Synthetic Data", 2016 IEEE Conference on Computer Vision and Pattern Recognition (CVPR), IEEE, pp. 4077-4085, Jun. 27, 2016.
Xu, K., et al., "Data-Driven Shape Analysis and Processing" Computer Graphics Forum, pp. 1-27, Feb. 24, 2015.
Shotton, J., et al., "Real-Time Human Pose Recognition in Parts from Single Depth Images", Communications of the ACM, vol. 56, No. 1, Jan. 2013.
Komodakis, N., et al.,. "Image Completion Using Efficient Belief Propagation via Priority Scheduling and Dynamic Pruning," IEEE Transactions on Image Processing 2007.
Komodakis, N., et al., "MRF Optimization via Dual Decomposition: Message Passing Revisited," IEEE Trans. 2011.
Komodakis, N., "Image Completion Using Global Optimization," CVPR 2006.
Kolmogorov, V. . "Convergent Tree-Reweighted Message Passing for Energy Minimization," Pattern Analysis and Machine Intelligence, IEEE 2006.
Zheng Jian-dong et al., "3D Curve Structure Reconstruction From a Sparse Set of Unordered Images," Computers in Industry 60 (2009).
Technion, Michael K., "On Edge Detection on Surfaces", IEEE, 2009.
Salamati, N., et al. "Incorporating Near-Infrared Information into Semantic Image Segmentation", CORR, Jun. 24, 2014.
Krahenbuhl, P., et al. "Efficient Inference in Fully Connected CRFs with Gaussian Edge Potentials" Computer Science Department, Stanford University, May 12, 2017.
Hoegner, L., et al. "Towards People Detection from Fused Time-of-Flight and Thermal Infrared Images" International Archives of the Photogrammetry, Remote Sensing and Spatial Information Sciences, vol. X1-3, Aug. 11, 2014.
European Search Report for EP 16 30 6860 dated May 19, 2017.

(56) References Cited

OTHER PUBLICATIONS

Lavoue, G., et al., "Markov Random Fields for Improving 3D Mesh Analysis and Segmentation," Eurographics Workshop on 3D Object Retrieval (2008).
Lee, Chang H., et al., "Mesh Saliency," Dept. of Computer Science, University of MD.
Lee, J., et al., "Interactive Retexturing from Unordered Images," 2014 11th International Conference on Ubiquitous Robots and Ambient Intelligence, pp. 18-21 (Nov. 12, 2014).
Xu, L., et al., "A General Texture Mapping Framework for Image-based 3D Modeling," 2010 Proceedings of 17th IEEE International Conference on Image Processing, 2010, pp. 2713-2716.
Dutagaci, H., et al. "Evaluation of 3D interest detection techniques via human-generated ground truth" Vis Compt 28:901-917; Jun. 29, 2012.
Chen, T., et al, "3-Sweep: Extracting Editable Objects from a Single Photo," SIGGRAPH Asia, 2013.
Autodesk 123D Catch; "123D Catch is a free app that lets you create 3D scans of virtually any object" www.123dapp.com/catch ; retrieved from Internet Jan. 14, 2016.
Wu, C., "VisualSFM: A Visual Structure from Motion System" http://homes.cs.washington.edu/~ccwu/vsfm/ ; retrieved from Internet Jan. 14, 2016.
Acute3D Capturing Reality; "Capturing reality with automatic 3D photogrammetry software" http://www.acute3d.com; retrieved from Internet Jan. 8, 2016.
Alexandre, L.A., "3D Descriptors for Object and Category Recognition: a Comparative Evaluation," IROS 2012.
Anguelov, D., et al., "SCAPE: Shape Completion and Animation of People," SIGGRAPH 2005.
Barbic, J., and James, D.L., "Real-Time Subspace Integration for St. Venant-Kirchhoff Deformable Models," SIGGRAPH 2005.
Barron, et al., "Shape, Illumination and Reflectance from Shading," EECS, 2013.
Calakli, F., and Taubin, G., "SSD: Smooth Signed Distance Surface Reconstruction," Pacific Graphics 2011.
Chen, Y., and Cipolla, R., "Single and Sparse View 3D Reconstruction by Learning Shape Priors," CVIU Journal 2011.
Cui, Y., et al., "3D Shape Scanning with a Time-of-Flight Camera," CVPR 2010.
Duncan, K., et al., "Multi-scale Superquadric Fitting for Efficient Shape and Pose Recovery of Unknown Objects," ICRA 2013.
Eitel, A., et al., "Multimodal Deep Learning for Robust RGB-D Object Recognition," International Conference on Intelligent Robots and Systems, 2015.
Eitz, M., et al., "Sketch-Based Shape Retrieval," SIGGRAPH, 2012.
Engel, J., et al., "LSD-SLAM: Large-Scale Direct Monocular SLAM," CVPR2014.
Faugeras, O., "Three-Dimensional Computer Vision: A Geometric viewpoint," MIT Press 1994.
Frefeld, O. and Black, M.J., "Lie Bodies: A Manifold Representation of 3D Human Shape," ECCV 2012.
Furukawa, Y., et al. "Towards Internet-scale Multi-view Stereo," CVPR 2010.
Hartley, R., and Zisserman, A., "Multiple View Geometry in Computer Vision," Cambridge Univ. Press 2004.
Hildebrandt, K., et al., "Eigenmodes of Surface Energies for Shape Analysis," Advances in Geometric Modeling and Processing 2012.
Newcombe, et al. "KinectFusion: Real-Time Dense Surface Mapping and Tracking," Symposium ISMAR 2011.
Kazhdan, M., et al. "Poisson Surface Reconstruction," Eurographics Symposium on Geometry Processing 2006.
Koutsourakis, P., et al., "Single View Reconstruction Using Shape Grammars for Urban Environments," ICCV 2009.
Li, Y., et al., "Database-Assisted Object Retrieval for Real-Time 3D Reconstruction," Eurographics, 2015.
Mairal, J., "Sparse Modeling for Image and Vision Processing, Foundations and Trends in Computer Graphics and Vision," 2014.
Nelder, J., and Mead, R., "A Simplex Method for Function Minimization," Computer Journal 1965.
Newcombe, R., et al., "Live Dense Reconstruction with a Single Moving Camera," IEEE ICCV2011.
Prados, et al., "Shape from Shading ," Handbook of Mathematical Models in Computer Vision, 2006.
"Reconstruct your world with ReconstructMe", reconstructme.net; retrieved from Internet Jan. 14, 2016.
Rother, C., et al., "GrabCut—Interactive Foreground Extraction using Iterated Graph Cuts," SIGGRAPH 2004.
Rusu, R.B., et al., "Fast Point Feature Histograms (FPFH) for 3D Registration," ICRA 2009.
SDK for Kinect, KinectFusion, http://www.microsoft.com retrieved from Internet Jan. 14, 2016.
Sifakis, E.D., "FEM Simulation of 3D Deformable Solids: A Practitioner's Guide to Theory, Discretization and Model Reduction," SIGGRAPH 2012 Course.
Szeliski, R., "Computer Vision: Algorithms and Applications," Edition Springer 2010.
Oswald, M., et al., "Fast and Globally Optimal Single View Reconstruction of Curved Objects," CVPR, 2012.
Tombari, T., et al., "Unique Signatures of Histograms for local Surface Description," ECCV 2010.
Wohlhart, P., and Lepetit, V., "Learning Descriptors for Object Recognition and 3D Pose Estimation," Computer Vision and Pattern Recognition, 2015.
Zheng, et al., "Interactive Images: Cuboid Proxies for Smart Image Segmentation," SIGGRAPH, 2012.
Azariadis, P.N. et al., "Drawing curves onto a cloud of points for point-based modelling," Computer-Aided Design, 37(1): 109-122 (Jan. 1, 2005).
Dutton, R.D., et al., "Efficiently Identifying the Faces of a Solid", Computers and Graphics, Elsevier, GB, 7:2, 143-147, 1983.
European Search Report and Written Opinion for European Application No. EP13305751, completed Oct. 28, 2013.
Fabbri, R. et al., "3D Curve Sketch: Flexible Curve-Based Stereo Reconstruction and Calibration," 2010 IEEE Conference on Computer Vision and Pattern Recognition (CVPR), Jun. 13-18, 2010, San Fancsico, CA, USA, pp. 1538-1545.
Hanrahan, P.: "Creating Volume Models from Edge-Vertex Graphs", Proceedings of the 9th Annual Conference on Computer Graphics and Interactive Techniques , SIGGRAPH '82, vol. 16, 1982, pp. 77-84.
Inoue, K., et al. "Solid Model Reconstruction of Wireframe CAD Models Based on Topological Embeddings of Planar SRAPHS", 2003.
Jian-dong, Z. et al., "3D curve structure reconstruction from a sparse set of unordered images," Computers in Industry, 60(2): 126-134 (Feb. 1, 2009).
Kuo, M.H. "Automatic extraction of quadric surfaces from wireframe models", Computers & Graphics, 25:1, Feb. 2001 (Feb. 2001).
Reisner-Kollmann, I. et al., "Interactive reconstruction of industrial sites using parametric models," Proceedings of the 26th Spring Conference on Computer Graphics, SCCG '10, Jan. 1, 2010, p. 101.
Van den Hengel, A. et al., "VideoTrace: Rapid interactive scene modelling from video," ACM Transactions on Graphics, 26(3): 86-1-86-5 (Jul. 29, 2007).
Varady, T. et al, "Reverse Engineering of Geometric Models—An Introduction," Computer-Aided Design, 29(4): 255-268 (Apr. 1, 1997).
Wu, H. et al., "Photogrammetric reconstruction of free-form objects with curvilinear structures," Visual Comput, 21(2): 203-216 (May 1, 2005).
Alj, Y. et al., "Multi-Texturing 3D Models: How to Choose the Best Texture?", *IC3D Belgium (2012)*, hal-00785836, Version 1, 8 pages (Feb. 7, 2013).
Allène, C. et al., "Seamless Image-Based Texture Atlases using Multi-band Blending", 4 pages.
Baumberg, A. "Blending images for texturing 3D models", *BMVC 2002*, 404-413 (2002).
Bernardini, F. et al., "High-Quality Texture Reconstruction from Multiple Scans", 14 pages.

(56) References Cited

OTHER PUBLICATIONS

Callieri, M. et al., "Masked Photo Blending: mapping dense photographic dataset on high-resolution sampled 3D models", (Jan. 8, 2008).
Canny, J. "A Computational Approach to Edge Detection", IEEE Transactions on Pattern Analysis and Machine Intelligence, PAMI-8(6): 679-698 (Nov. 1986).
Carr, N.A. and Hart, J.C., "Meshed Atlases for Real-Time Procedural Solid Texturing", *ACM Transactions on Graphics*, 21(2): 26 pages (Apr. 2002).
Clark, X.B. et al., "An Investigation into Graph Cut Parameter Optimisation for Image-Fusion Applications", *IVCNZ '12*, Dunedin, New Zealand, 6 pages (Nov. 26-28, 2012).
Colburn, A., et al., "Image-Based Remodeling", *IEEE Transactions on Visualization and Computer Graphics*, 13 pages (2012).
Cui, Y. et al., "3D Shape Scanning with a Time-of-Flight Camera", 8 pages (2010).
Debevec, P.E. et al., "Modeling and Rendering Architecture from Photographs: A hybrid geometry- and image-based approach", Presented at Computer Graphics Proceedings, Annual Conference Series, New Orleans, Lousiana, pp. 11-20 (Aug. 4-9, 1996).
Dellepiane, M. et al., "Flow-based local optimization for image-to-geometry projection", *IEEE Transactions on Visualization and Computer Graphics*, pp. 1-12.
Eisemann, M. et al., "Floating Textures", *Eurographics*, 27(2): 10 pages (2008).
European Search Report completed Mar. 26, 2014 for European Application No. EP13306576 entitled "Computing Camera Parameters".
Goldlücke, B. and Cremers, D., "A Superresolution Framework for High-Accuracy Multiview Reconstruction", 10 pages.
Hale, J.G. "Texture re-mapping for decimated polygonal meshes", University of Edinburgh, pp. 1-12.
Hanusch, T., "A New Texture Mapping Algorithm for Photorealistic Reconstruction of 3D Objects", *The International Archives of the Photogrammetry, Remote Sensing and Spatial Information Sciences*, Beijing, vol. XXXVII(Part B5): 699-706 (2008).
Ishikawa, H., "Higher-Order Clique Reduction in Binary Graph Cut", *IEEE*, pp. 2993-3000 (2009).
Kappes, J.H. et al., "A Comparative Study of Modern Inference Techniques for Discrete Energy Minimization Problems", 8 pages.
Kurazume, R., et al., "Simultaneous 2D images and 3D geometric model registration for texture mapping utilizing reflectance attribute", Presented at the 5th Asian Conference on Computer Vision, Melbourne, Austrailia, pp. 1-8 (Jan. 23-25, 2002).
Laure, F. et al., "Automatic Texturing without Illumination Artifacts from In-hand Scanning Data Flow", *Artifacts Free Automatic Texturing for In-Hand Scanning*, pp. 1-13.
Lempitsky, V. and Ivanov, D., "Seamless Mosaicing of Image-Based Texture Maps", 6 pages.
Lensch, H.P.A. et al., "Automated Texture Registration and Stitching for Real World Models", 13 pages.
Lévy, B. et al., "Least Squares Conformal Maps for Automatic Texture Atlas Generation", 10 pages.
Lourakis, M.I.A. and Argyros, A.A., "SBA: A Software Package for Generic Sparse Bundle Adjustment", *ACM Transactions on Mathematical Software*, 36(1): pp. 2:1-2:30 (Mar. 2009).
Moslah, O. et al., "Geo-Referencing Uncalibrated Photographs using Aerial Images and 3D Urban Models", 6 pages (Jan. 1, 2009).
Moslah, O. et al., "Urban Models Texturing from Un-Calibrated Photographs", *IVCNZ*, 23rd International Conference, IEEE, Piscataway, NJ pp. 1-6 (Nov. 26, 2008).
Newcombe, R.A., et al., "KinectFusion: Real-Time Dense Surface Mapping and Tracking*" 10 pages.
Rocchini, C., et al., "Multiple Textures Stitching and Blending on 3D Objects", Istituto di Elaborazione dell'Informazione, 13 pages.
Štencel, M. and Janáček, J., "On Calculation of Chamfer Distance and Lipschitz Covers in Digital Images", 6 pages.
Surazhsky, T. et al., "A Comparison of Gaussian and Mean Curvatures Estimation Methods on Triangular Meshes", 6 pages.
Wang, L. et al., "Optimal Texture Map Reconstruction from Multiple Views", 8 pages.
Zhang, E. et al., "Feature-Based Surface Parameterization and Texture Mapping", *ACM Transactions on Graphics*, 24(1): 1-27 (Jan. 2005).
Zhang, Z., "A Flexible New Technique for Camera Calibration", Microsoft Corporation, Technical Report MSR-TR-98-71, 22 pages (Dec. 2, 1998).
Zhou, K. et al., "TextureMontage: Seamless Texturing of Arbitrary Surfaces From Multiple Images", 8 pages.
European Search Report for EP 16 30 6838 dated Jul. 20, 2017.
Sahu, T., et al. , "Image Enhancement Based on Abstraction and Neural Network", International Journal of Scientific Engineering and Technology, pp. 2277-1581148. Apr. 2012.
Landau, M., et al., "Simulating Kinect Infrared and Depth Images", IEEE Transactions of Cybernetics, vol. 46, No. 12, pp. 3018-3031; Nov. 13, 2015.
Ley, A., et al., SyB3R: A Realistic Synthetic Benchmark for 3D Reconstruction from Images, Network and Parallel Computing, pp. 23-251, Sep. 16, 2016.
Komodakis, N., et al. "MRF optimization via dual decomposition: Message-passing revisited." Computer Vision, IEEE 11th International Conference 2007.
Sculpteo, "MeshMixer Tutorial Part1: Modeling for 3D Printing", https://youtube.com/watch?v=WwIM4FP2SgA, retrieved from Internet Sep. 13, 2017.

* cited by examiner

COMPUTING CAMERA PARAMETERS

RELATED APPLICATION(S)

This application claims priority under 35 U.S.C. § 119 or 365 to European Application No. EP13306576.3, filed Nov. 18, 2013. The entire teachings of the above application(s) are incorporated herein by reference.

FIELD OF THE INVENTION

The invention relates to the field of computer programs and systems, and more specifically to a method, system and program for designing a 3D modeled object representing a real object.

BACKGROUND OF THE INVENTION

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

In this context, the field of computer vision and computer graphics offers technologies which are more and more useful. Indeed, this field has applications to 3D reconstruction, and all domains where it is necessary to precisely build a 3D scene with exact geometry using as input, for example, the information in a set of photographs. 3D reconstruction from video stream and photographs set analysis is addressed in two different approaches in the state of the art, depending on the type of sensors used for the input data.

The first approach uses "receiver" sensors. This notably concerns 3D reconstruction from RGB images analysis. Here, 3D reconstruction is obtained by multi-view analysis of RGB color information contained in each of the image planes. The following papers relate to this approach:

R. Hartley and A. Zisserman: Multiple View Geometry in Computer Vision, Cambridge Univ. Press 2004;

R. Szeliski: Computer Vision: Algorithms and Applications, Edition Springer 2010; and O. Faugeras: Three-Dimensional Computer Vision: A Geometric viewpoint, MIT Press 1994.

The second approach uses "emitter-receiver" sensors. This notably concerns 3D reconstruction from RGB-Depth images analysis. This kind of sensors gives additional depth data to standard RGB data, and it is depth information that is mainly used in the reconstruction process. The following papers relate to this approach:

Yan Cui et al.: 3D Shape Scanning with a Time-of-Flight Camera, CVPR 2010;

R S. Izadi et al.: KinectFusion: Real-Time Dense Surface Mapping and Tracking, Symposium ISMAR 2011; and R. Newcombe et al.: Live Dense Reconstruction with a Single Moving Camera, IEEE ICCV2011.

Moreover, several academic and industrial players now offer software solutions for 3D reconstruction, by RGB image analysis, such as Acute3D, Autodesk, VisualSFM, or by RGB-Depth analysis, such as ReconstructMe or Microsoft's SDK for Kinect (registered trademarks).

Multi-view photogrammetry reconstruction methods use the sole information contained in the image plans of a video sequence (or a series of snapshots) in order to estimate 3D geometry of the scene. The matching of interest points between different ones of the 2D views yields the relative positions of the camera. An optimized triangulation is then used to compute the 3D points corresponding to the matching pair. Depth-map analysis reconstruction methods are based on disparity maps or approximated 3D point clouds. Those disparity maps are obtained using stereovision or structured light (see the 'Kinect' device for example) or 'Time of Flight' 3D-cameras. These state-of-the-art reconstruction methods then typically output a discrete 3D representation of the real object, most often a 3D mesh. The 3D model derives from the in fine volume closing off the resulting 3D point cloud.

A further step known from the prior art is to produce a texture for each polygon on the 3D mesh. In order to ensure photo-realism, prior art requires that the rendering use standard images from high-quality devices capturing the scene simultaneously. This is explained in the paper by T. Hanusch, A new texture mapping algorithm for photorealistic reconstruction of 3D objects, in ISPRS journal of photogrammetry and remote sensing.

FIG. 1 illustrates a common approach used to texture a 3D model with a photograph, which is the well-known projective texture mapping method. This method is described for example in the paper by P. Debevec, C. Taylor and J. Malik, Modeling and Rendering Architecture from Photographs: A hybrid geometry- and image-based approach, in SIGGRAPH 1996. This method uses image projection data associated to a 2D view (relative to the 3D model) to compute the mapping to the 3D model. FIG. 1 shows such a view-dependent 3D model texturing principle for 3D meshed model 102 and calibrated image 104: a projection texture mapping (represented by bundle 106, computed from camera projection matrix and departing from optical center 108) is used to estimate the texture coordinate for each triangle vertex.

Now, as illustrated on FIG. 2, the texturing quality by projection onto the 3D model is highly dependent on camera pose estimation. Indeed, FIG. 2 illustrates the 3D model texturing problematic: on the left, accurate calibration data allows coherent texturing 104 by projection on 3D model 102, whereas, on the right, inaccurate calibration data induces a drift in the projection of texturing 104 relative to 3D model 102. In other words, the estimation of camera rotation and translation at the time of the snapshot has a high impact on the final texturing. Obviously, any bias on the camera pose translates onto the re-projection and deteriorates the texturing process. Such a bias is usual particularly significant in the case of depth-map analysis methods. It generally originates from a shift in synchronizing between the depth sensor and the RGB sensor, corrupting the camera trajectory estimation. But it may also originate from an outside shot from an independent camera whose relative position to the 3D model cannot be estimated with sufficient accuracy because there is no rigid dependency to the depth sensor.

Within this context, there is still a need for an improved solution for designing a 3D modeled object representing a real object.

SUMMARY OF THE INVENTION

It is therefore provided a computer-implemented method for designing a 3D modeled object representing a real object. The method comprises the step of providing a 3D representation of the real object. The method also comprises the step of identifying occurrences of a geometric feature at 3D positions of the 3D representation. The method also comprises the step of providing at least one 2D view of the real object. The method also comprises the step of identifying occurrences of a graphic feature at 2D positions of the 2D view, the geometric feature corresponding to the graphic feature. The method also comprises the step of computing camera parameters that minimize a distance between a set of projections of the 3D positions on the 2D view and a set of 2D positions.

The method may comprise one or more of the following:

the geometric feature relates to the 3D curvature and the graphic feature relates to a pixel gradient, the 2D view being an image of the real object;

the geometric feature is a 3D curvature above a predetermined threshold and the graphic feature is a pixel gradient above a predetermined threshold;

the method further comprises determining a texture mapping between the 3D representation and the 2D view based on the computed camera parameters;

the identifying of occurrences of the graphic feature includes first applying a Gaussian blur on the 2D view;

the method further comprises, prior to the computing, filtering 3D positions of the 3D representation according to criteria evaluated according to a predetermined estimation of the camera parameters;

the criteria include visibility on the 2D view and/or distance of the projection with borders of the 2D view;

the identifying of occurrences of the graphic feature is iterated, with an increasing number of occurrences of the graphic feature at each iteration, and the computing of camera parameters includes an iterative optimization algorithm;

the identifying of occurrences of the graphic feature is iterated over resized versions of the 2D view, that are ordered from the smallest to the largest;

the intrinsic camera parameters are predetermined, the computed camera parameters thereby being the extrinsic camera parameters;

providing the 3D representation of the real object comprises reconstructing the 3D representation from measurements of at least one depth sensor; and/or the 2D view is an image captured by a high resolution camera and/or by a camera synchronous to the depth sensor.

It is further provided a computer program comprising instructions for performing the method.

It is further provided a computer readable storage medium having recorded thereon the computer program.

It is further provided a system comprising a processor coupled to a memory and a graphical user interface, the memory having recorded thereon the computer program.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

Embodiments of the invention will now be described, by way of non-limiting example, and in reference to the accompanying drawings, where.

DETAILED DESCRIPTION OF THE INVENTION

A description of example embodiments of the invention follows.

The teachings of all patents, published applications and references cited herein are incorporated by reference in their entirety.

Figure 3:
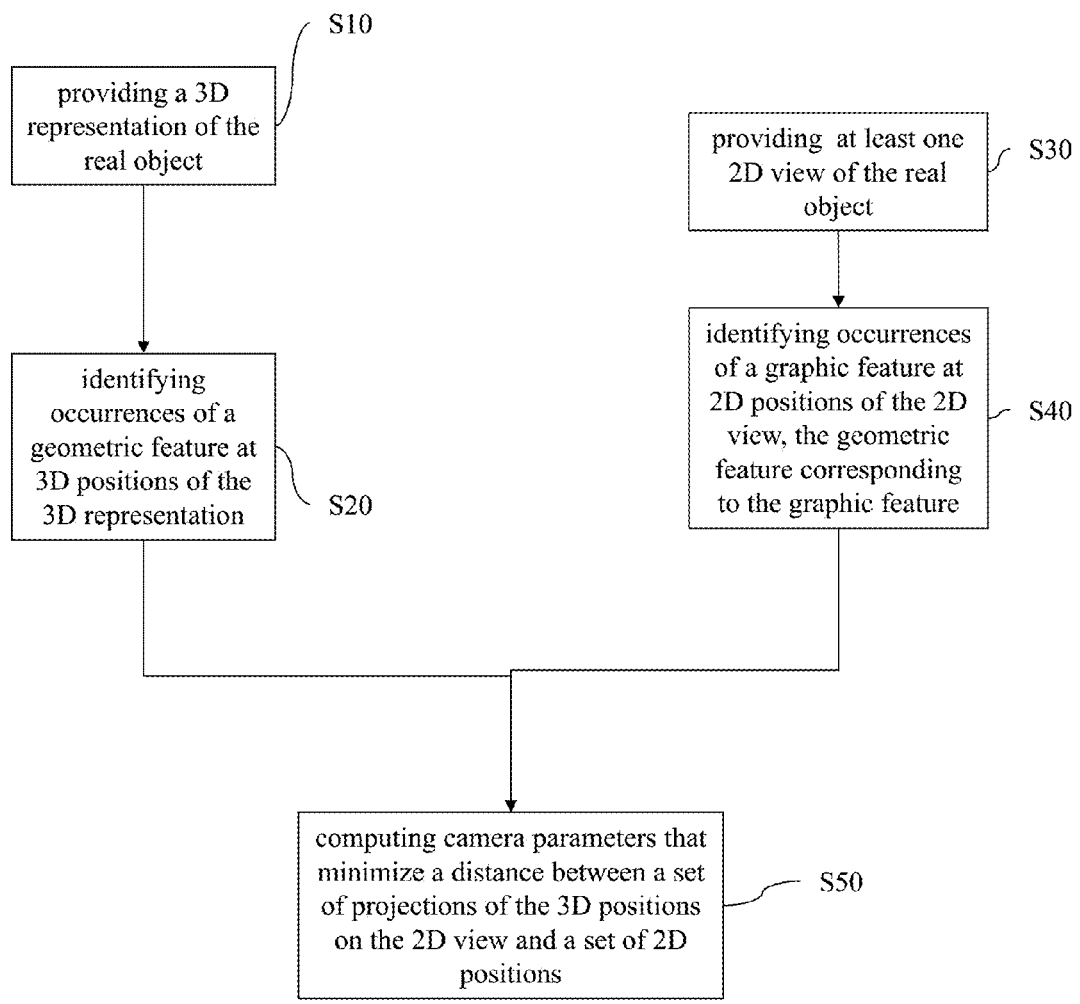
FIG. 3 shows a flowchart of an example of the method.

With reference to the flowchart of FIG. 3, it is proposed a computer-implemented method for designing a 3D modeled object. The 3D modeled object designed by the method represents a real object. The method comprises the step of providing S10 a 3D representation of the real object. The method also comprises the step of identifying S20 occurrences of a geometric feature at 3D positions of the 3D representation. The method also comprises the step of providing S30 at least one 2D view of the real object. The method also comprises identifying S40 occurrences of a graphic feature at 2D positions of the 2D view. The geometric feature corresponds to the graphic feature. The method eventually comprises computing S50 camera parameters that minimize a distance between a set of projections of the 3D positions on the 2D view and a set of 2D positions. Such a method improves the design of a 3D modeled object representing a real object.

Notably, the method respectively identifies at S20 and S40 occurrences of a geometric feature (in 3D) and of a graphic feature (in 2D) that correspond to each other, respectively in terms of 3D positions and 2D positions. Said correspondence information is then used to compute at S50 camera parameters. Indeed, the camera parameters are computed such that they minimize a distance between a set of projections of (at least some of) the 3D positions and a set of (at least some of the) 2D positions. The projections of the 3D positions depend on the camera parameters, the latter being thereby involved as an argument of an optimization problem. The method indeed solves an optimization problem which captures the predetermined constraint that the geometric feature corresponds to the graphic feature. Said constraint is known beforehand, and the method applies this knowledge to the provided geometry. As for the implementation, specifically, the method identifies occurrences of said geometric and graphic features and describes said occurrences in terms of 3D and 2D positions to later simply minimize a distance. Therefore, the method makes use of geometric information contained in the 3D representation, of graphic information contained in the 2D view, and of their correspondence, in order to compute camera parameters, relatively accurately and fast. The camera parameters may then be used for different applications involving the 2D view, and also possibly the 3D representation, including texturing the 3D representation according to the 2D view. Thanks to the method providing relatively accurate camera parameters, these applications are performed relatively accurately.

The method is computer-implemented. This means that the steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement the user's wishes. In examples, this level may be user-defined and/or pre-defined. For instance, the step of identifying S20 and/or the step of identifying S40 may fully automatic, as discussed later, but they may alternatively involve some manual user-interaction. The user may indeed directly identify/add occurrences of geometric features and/or graphic features on the 3D representation and/or the 2D view.

A typical example of computer-implementation of the method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

The method generally manipulates modeled objects. A modeled object is any object defined by data stored in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a real object such as a product such as a part or an assembly of parts, or possibly an assembly of products. By "3D modeled object", it is meant any object which is modeled by data allowing at least its 3D representation (the 3D representation in the case of the method). A 3D representation allows the viewing of the part from all angles. For example, the 3D representation may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

By PLM system, it is meant any system adapted for the management of a modeled object representing a physical manufactured product. In a PLM system, a modeled object is thus defined by data suitable for the manufacturing of a physical object. These may typically be dimension values and/or tolerance values. For a correct manufacturing of an object, it is indeed better to have such values.

CAM stands for Computer-Aided Manufacturing. By CAM solution, it is meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systémes under the trademark DELMIA®.

CAE stands for Computer-Aided Engineering. By CAE solution, it is meant any solution, software of hardware, adapted for the analysis of the physical behavior of modeled object. A well-known and widely used CAE technique is the Finite Element Method (FEM) which typically involves a division of a modeled objet into elements which physical behaviors can be computed and simulated through equations. Such CAE solutions are provided by Dassault Systémes under the trademark SIMULIA®. Another growing CAE technique involves the modeling and analysis of complex systems composed a plurality components from different fields of physics without CAD geometry data. CAE solutions allows the simulation and thus the optimization, the improvement and the validation of products to manufacture. Such CAE solutions are provided by Dassault Systémes under the trademark DYMOLA®.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systèmes under the trademark ENOVIA®.

Figure 4:
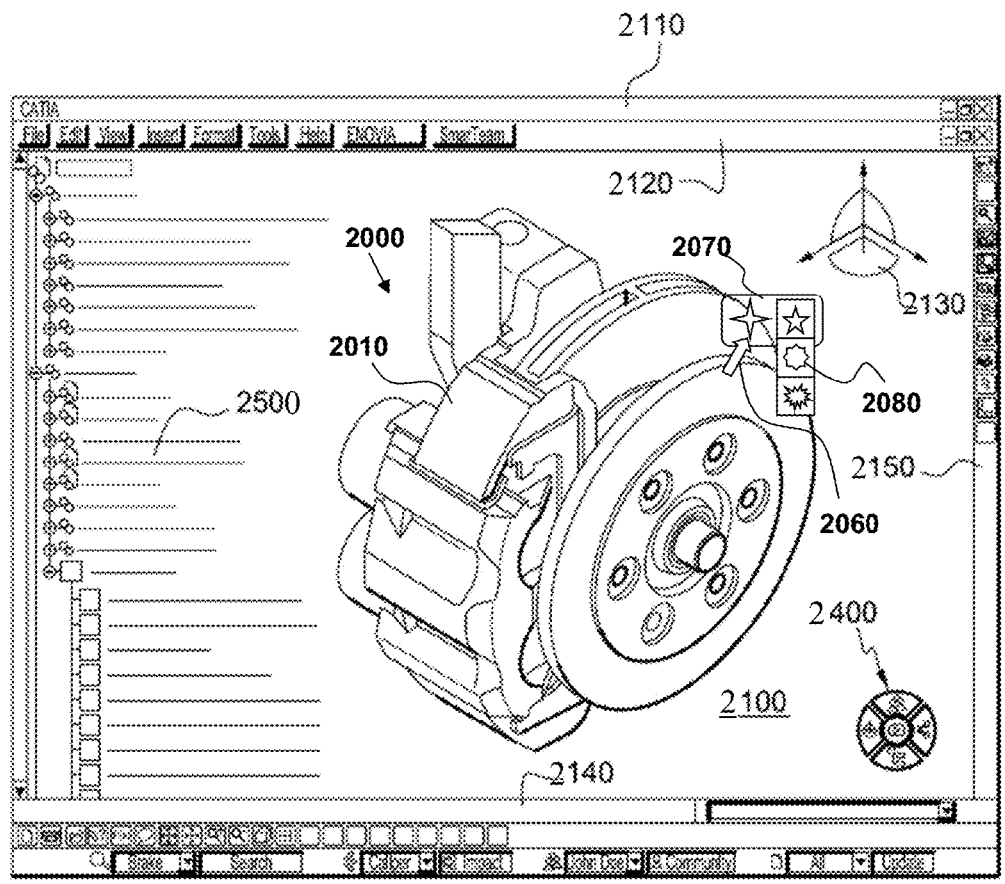
FIG. 4 shows an example of a graphical user interface of the system.

FIG. 4 shows an example of the GUI of the system, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen.

Figure 1:
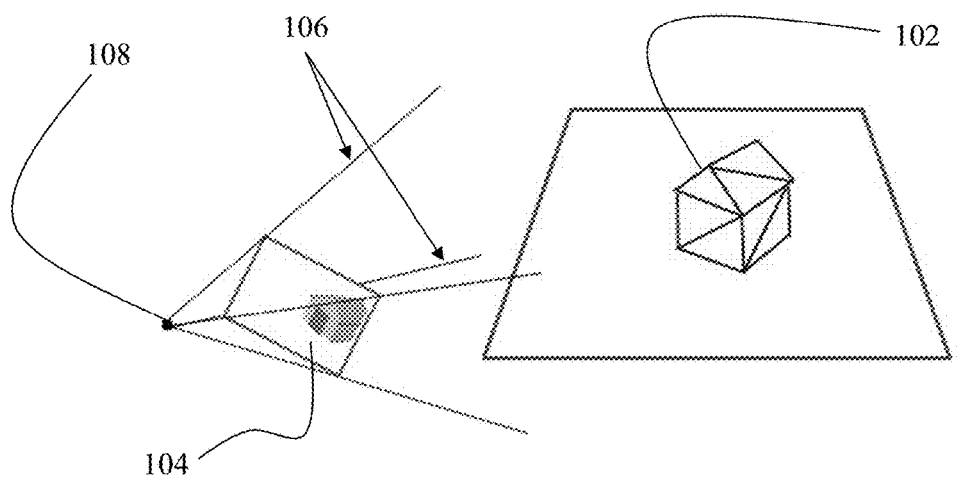
FIGS. 1-2 illustrate the prior art.
Figure 2:
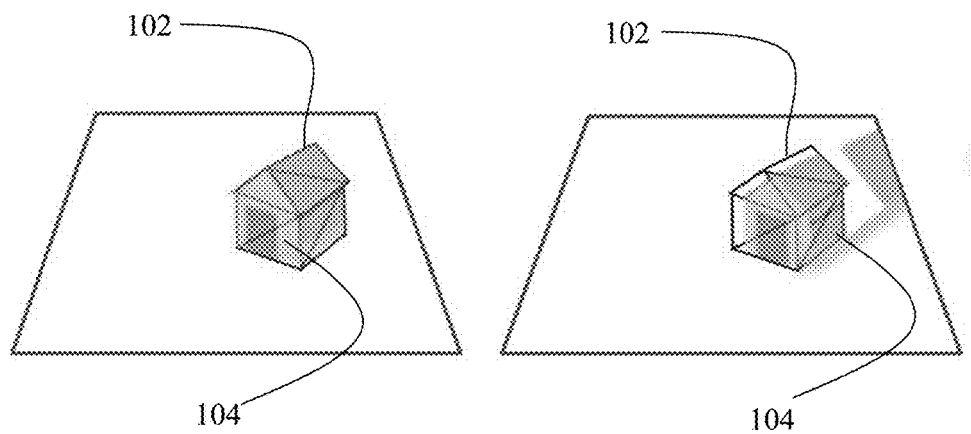

The GUI may for example display data 2500 related to the displayed product 2000. In the example of FIG. 2, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 5:
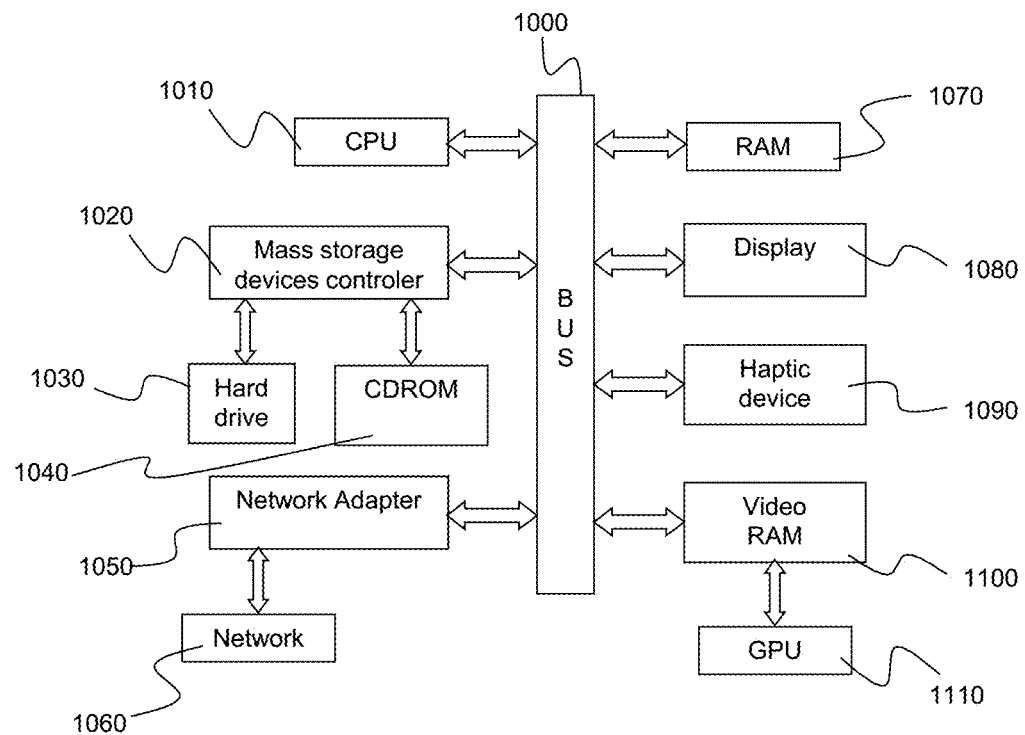
FIG. 5 shows an example of the system.

FIG. 5 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

"Designing a 3D modeled object" designates any action or series of actions which is at least part of a process of elaborating a 3D modeled object. Thus, the method may comprise creating the 3D modeled object from scratch. Alternatively, the method may comprise providing a 3D modeled object previously created, and then modifying the 3D modeled object.

The method may be included in a manufacturing process, which may comprise, after performing the method, producing a physical product corresponding to the modeled object. In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process.

The providing S10 of a 3D representation of the real object is now discussed.

As known from the prior art, a real object may be represented by a CAD system in 3D with different data structures that correspond to different geometries. In the case of the method, the 3D representation (which may also be called "3D model" in the following) provided at S10 may be any representation, including discrete representations or parameterized representations.

A discrete representation is defined referring to the fact that such a representation describes a 3D modeled object as a discrete aggregation of geometrical components that locally represent the geometry (e.g. the surface) describing the object. This aggregation provides a comprehensive description of the object, meaning than no other data or little other data is needed. Typically, a discrete 3D representation may be any or a combination of a point cloud, a mesh, a depth map and/or an implicit function, that describe the 3D modeled object as an outer surface and/or as a solid. These representations are well known from the prior art.

Prior art 3D reconstruction techniques provide such a discrete 3D representation, as known. Examples of such techniques generally include performing measurements on a real object with sensors, and inferring the discrete 3D representation from the measurements. The technique may be structure from motion analysis, meaning that multi-view images of the real object are captured to infer the discrete 3D representation via a mathematical model. The first approach (only RGB data) and the second approach (RGB and depth data) presented in the prior art constitute structure from motion analysis foreseen for the method. The discrete 3D representation may also be obtained by laser triangulation, and/or acoustic propagation analysis, combinations of different techniques being also foreseen.

In the case of a structure from motion analysis consisting of 3D Reconstruction from RGB images, the method may comprise matching interest 2D points between images. Then the method may calibrate the cameras, e.g. by estimating the position relative to the observed scene (extrinsic calibration) and estimate physical parameters of the sensors (e.g. focal, distortion-intrinsic calibration). Then the method may triangulate the match point with calibration data to estimate 3D positions (e.g. point cloud generation). Then the method may build a 3D mesh model from all 3D triangulated points, thereby reaching the discrete 3D representation. Reference is made to previously cited papers Hartley and Zisserman, Szeliski, and Faugeras for details on the above steps.

In the case of a structure from motion analysis consisting of 3D Reconstruction from RGB-Depth, the method may mainly use depth images (i.e. image that contains disparity information for each pixel). The method may first build the 3D scene from a first depth image (i.e. 3D point cloud generation from disparity values). The method may then, for each new depth image, estimate extrinsic camera calibration (e.g. -rotation and translation—of camera from previous point of view). The method may update the global 3D point cloud. The method may finally generate a 3D mesh model from point cloud analysis, thereby reaching the discrete 3D representation. Reference is made to previously cited papers Cui et al. and Newcombe et al. for details on the above steps.

The providing S10 may thus result from applying such a technique, within the method or prior to the method. The system may thus comprise at least one sensor coupled to the processor to provide sensing measurements, the system comprising instructions in its programs to determine the discrete 3D representation according to the measurements. Preferably, the system comprises at least one depth sensor, such that the method may perform depth measurements that output a relatively accurate 3D representation of the real object. This is known from the prior art, as discussed earlier.

Alternatively, the 3D representation may be a parametric representation. A parameterized representation is defined referring to the fact that such a representation describes a 3D modeled object as a parameterized function that outputs the geometry (e.g. the surface) describing the object when entering parameter values chosen in a predetermined domain. An example of a parameterized representation is a set of parametric 3D curves to represent the real object. Such a representation may actually be derived from a discrete representation as the ones discussed above.

Indeed, the parameterized representation may for example be obtained by a process that comprises the step of providing a discrete 3D representation of the real object. The process also comprises the step of providing at least one calibrated 2D view of the real object (e.g. the view provided at S30 and discussed later). The process also comprises the step of defining parametric 2D curves on the 2D view. Then, the process comprises the step of mapping the 2D curves on the discrete 3D representation. Moreover, the process comprises the step of fitting the result of the mapping with parametric 3D curves. The 3D curves thereby represent the real object. This process may be performed according to a European patent application number 13306573.0 filed by the same Applicant and on the priority date of the present application, which is incorporated herein by reference.

Such a process outputs parametric 3D curves to represent the real object starting from a discrete 3D representation. In other words, the process transforms a discrete representation of the real object into a parameterized representation, thereby achieving advantages well-known in 3D CAD. First of all, the representation of the real object as parametric 3D curves is lighter than a discrete representation, such as a mesh. This allows space saving and CPU saving when handling the modeled object, for example for performing modifications. For example, the memory space occupied by the set of parametric 3D curves representing the real object and fitted may be lower than a tenth of the memory space occupied by the discrete representation provided. In another example, the number of parametric 3D curves fitted may be lower than ten, a hundred or even at least a thousand times the number of components of the discrete representation provided (e.g. triangles in case of a triangle mesh). Furthermore, providing a parameterized representation of the real object allows computing exact positions for any point of the outer surface of the real object, whereas such positions are approximated in case of a discrete representation such as a mesh (by small plane triangles in such a case). This achieves many advantages, including the possibility to zoom in the 3D representation without appearance of any artifacts or unwished discontinuities (similarly to the zoom in of an image represented by vector graphics rather than pixels). Also, the process smartly takes advantage of at least one calibrated 2D view of the real object to output the set of parametric 3D curves representing the real object. This is done by the defining, the mapping and the fitting which make use of the 2D view. Defining 2D curves on the 2D view allows to simply arrive at parametric 3D curves via a correspondence between 3D curves and 2D curves, such correspondence being ensured by the way the mapping and then the fitting operate. Making use of such a 2D view allows eventually achieving a result which is close to the real object in terms of accuracy. The process may thus be used to "correct" the 3D representation provided, meaning that the method may increase the accuracy of the 3D representation by constructing the parametric 3D curves, for example by discarding holes and/or outliers in the discrete representation. Also, the process may "smoothen" the discrete representation, by switching from a discrete representation to a parametric representation.

The providing S30 of at least one 2D view of the real object is now discussed.

A view of the real object is any graphical representation of the real object, such as an image, a photo, a picture. A 2D view is thus a 2D representation allowing the viewing of the real object from only one angle/point of view, as opposed to the definition of 3D representation provided earlier. The providing S30 may generally be performed independently of the providing S10, such that it may be performed concomitant, prior or after the providing 10.

In the case of the method, the 2D view provided at S30 may be calibrated or un-calibrated. A calibrated view is one that is provided together with information ("calibration information") that allows the correspondence between positions on the 2D view and positions in a corresponding 3D representation, e.g. the 3D representation provided at S10. For example, such information may comprise camera parameters, which are parameters that represent the configuration of a camera having captured the 2D view (possibly virtually). In other words, the camera parameters constitute information that allow an a posteriori description of a camera that could have captured the 2D view, relative to the 3D representation. In case the 2D view provided at S30 is un-calibrated or calibrated relative to a representation from the 3D representation provided at S10, the method allows calibrating the 2D view, relative to the 3D representation provided at S10, by computing at S50 said camera parameters. In case the 2D view provided at S30 is already calibrated relative to the 3D representation provided at S10, the method allows improving the calibration of the 2D view by computing at S50 camera parameters that are more accurate (in other words, by optimizing the previous camera parameters). In both cases this is done relative to the 3D representation, starting from the hypothesis that the 3D representation is a relatively accurate representation of the real object.

In the case the discrete 3D representation is an output of a structure from motion analysis, the 2D view of the real object may be captured during this structure from motion analysis. In other words, structure from motion analysis may be used for the providing S10, involving at least one 2D view, e.g. an RGB image, and said 2D view may efficiently be the one provided at S30 (which in this case depends on the providing S10). Indeed, the structure from motion analysis, based on at least one 2D view as input, outputs data describing projection from the discrete 3D representation onto the input 2D view. However, although the 2D view is calibrated in this case (i.e. positions of the 2D view correspond to positions of the 3D representation according to the calibration information, as they both correspond to the real positions of the real object when performing the structure from motion analysis), said calibration data is not perfectly accurate, and the method therefore advantageously corrects said data by computing at S50 relatively accurate camera parameters (i.e. by optimizing the previous camera parameters). This is particularly true in the case the 3D representation of the real object is provided by reconstructing the 3D representation from measurements of at least one depth sensor. In such a case indeed, the depth data are mainly used for determining the 3D representation, and 2D data, such as RGB images, are mainly used for other purposes (such as texturing the 3D representation). For this reason, the 2D view may be captured by a high resolution camera (providing data with at least higher resolution than the depth sensor or other cameras capturing images used to reconstruct the initial 3D representation). Thus, although the 2D view is captured by a camera synchronous to the depth sensor, there may be a shift leading to a lack of accuracy, as explained above. The method therefore computes camera parameters that are more accurate for said RGB images.

The camera parameters that are computed at S50 are now discussed.

These camera parameters allow the correspondence between positions on the 2D view and positions in the 3D representation provided at S10. The camera parameters are thus associated to the 2D view, and relative to the 3D representation provided at S10. For that, the camera parameters may include a projection matrix (e.g. describing projection from the 3D representation to the 2D view). The projection matrix may be based on a referential associated to the 3D representation and on a referential associated to the 2D view. As known, the projection matrix may include extrinsic parameters, such as 3D position of point of view, e.g. camera position, and/or orientation, e.g. rotation and translation data, and/or intrinsic parameters, such as focal length, skew parameter, principal point, and/or distortion parameters. The intrinsic parameters are parameters related to the sensor (e.g. focal, optical center projection, distortion) and are generally estimated in the prior art by an offline process as defined in the paper by Z. Zhang, A Flexible New Technique for Camera Calibration, in International Conference on Computer Vision 1999. The extrinsic parameter, also called "pose parameters", are related to the position (e.g. rotation matrix and translation vector) of the image in the referential of the 3D scene (here the 3D reconstructed model). A classical way to estimate these pose parameters known from the prior art is to approximate them during a reconstruction process such as the ones mentioned above, as in RGB-Depth based reconstruction (such as described in the previously mentioned paper by Izadi et al), where RGB pose is deduced from depth camera positioning. This is made possible because both sensors (RGB and depth) are rigidly connected, that so there is only relative transformation to change referential axis.

In the case of the method, camera parameters associated to the 2D view may be predetermined or not. For example, intrinsic camera parameters may be predetermined, by being previously estimated, not necessarily accurately, e.g. acquired via any offline process known from the prior art, and/or extrinsic camera parameters may be predetermined, e.g. approximated through deduction from depth camera positioning (for example in the case of the 3D representation is provided at S10 after performing a reconstruction that is a motion from structure analysis based on RGB-Depth data and the 2D view provided at S30 is an RGB image captured during said reconstruction by a camera synchronous to the depth sensor) or manually estimated. However, the method computes at S50 camera parameters such that the newly computed camera parameters are more accurate than the predetermined ones, e.g. leading to an accurate texturing.

A specific case is one wherein the intrinsic camera parameters are predetermined. In this case, the camera parameters computed at S50 may be (only) the extrinsic camera parameters. Indeed, techniques that predetermine camera parameters provide a relatively accurate result in the case of intrinsic parameters. Thus, focusing on improving the accuracy of the extrinsic camera parameters only provides a good tradeoff between increase of accuracy and time required to perform the improvement.

The identifying S20 and the identifying S40 are now discussed, in order to highlight how exactly the camera parameters are computed at S50.

The method comprises identifying at S20 and S40 occurrences of features. As known in the field of computer science, objects may be defined by a type, and then be instantiated with specific parameter values. In the case of the method, these types comprise geometric features and graphic features. The method may thus comprise searching a predetermined list of geometric features and/or a predetermined list of graphic features, to evaluate if such features are instantiated in the data provided at S10 and/or S30 (i.e. to find "occurrences", or in other words "instances", of a feature). Thus, the identifying S20 and/or S40 may be performed fully automatically, according to evaluations classic in the field of computer science.

In specific, the identified occurrences are associated to positions of the 3D representation and/or the 2D view. This means that the method provides positions/locations of the 3D representation at S20 that are associated to the geometric feature and positions/locations of the 2D view at S40 that are associated to the graphic feature.

The feature of which occurrences are identified at S20 is a geometric feature. A geometric feature is any predetermined feature that characterizes the shape, or geometry, of the 3D representation. In an example provided below, the geometric feature relates to the 3D curvature of the 3D representation, meaning that the geometric feature describes particular information regarding the 3D curvature of the 3D representation. It is particularly easy to detect occurrences of this type of geometric feature. In the example, the geometric feature is specifically a 3D curvature above a predetermined threshold. In other words, the geometric feature occurs each time the 3D curvature of the 3D representation is above a threshold (that can be anything, provided it is predetermined). This makes the method work particularly efficiently.

The feature of which occurrences are identified at S40 is a graphic feature. A geometric feature is any predetermined feature that characterizes the graphics, or the visual aspect, of the 2D view. In the example provided below, the 2D view is an image of the real object (e.g. an RGB image) and the graphic feature relates to a pixel gradient, meaning that the graphic feature describes particular information regarding the pixel gradient (thus related to color gradient) of the 2D view. It is particularly easy to detect occurrences of this type of graphic feature. In the example, the graphic feature is specifically a pixel gradient above a predetermined threshold. In other words, the graphic feature occurs each time the pixel gradient of the 2D view is above a threshold (that is predetermined, and corresponds to the threshold predetermined and discussed above for the 3D curvature). Such a graphic feature corresponds to the geometric feature discussed above, the exact values of the predetermined thresholds being a matter of implementation.

Although examples that will be more extensively discussed later have already been provided, it has to be understood that the geometric feature and the graphic feature may be any predetermined features (of which occurrences are identified at S20 and S40 in any way), provided that they correspond to each other. By corresponding to each other, it is meant that the geometric feature corresponds to 3D positions/locations of the real object that result in the graphic feature when transposing the real object into 2D (by providing the 2D view). Continuing with the example provided above, a fold on the real object will generally result in a high curvature in the 3D representation (and thus occurrence of the geometric feature of the example) and it will generally result in a high gradient in the 2D view (and thus occurrence of the graphic feature of the example, that is considered by the method of the example as corresponding to the geometric feature). The method thus implements a predetermined knowledge that the geometric feature corresponds to the graphic feature. This knowledge can come from anywhere, and only one single example is discussed below. For example, this knowledge can result from experimentations within a specific application field of the method, the features thus depending on the field. Actually, this knowledge may comprise several geometric features and/or several graphic features, provided that it also comprises correspondences between them. And the method "matches" in a specific way (explained below) occurrences of the geometric feature with occurrences of the graphic feature to retrieve camera parameters (in a form of "reverse engineering"), so as to make efficient use of said knowledge.

Indeed, the method determines the camera parameters at S50 by computing the values of them that minimize a distance between a set of projections of the 3D positions on the 2D view and a set of 2D positions. In other words, a predetermined distance between two general sets of 2D points is considered, the two sets having the same number of elements or not (any distance may be contemplated, a specific example being provided later), and the camera parameters computed at S50 are the argument of the minimum of said distance evaluated between the set of projections of the 3D positions (obtained by projecting 3D positions on the 2D view provided at S30 according to the camera parameters associated to said 2D view—the camera parameters being the variable of the optimization problem—, e.g. the camera parameters taking the form of a projection matrix) and the set of 2D positions. As will be apparent later, the 3D positions identified at S20 and the 2D positions identified at S40 are not necessarily all involved in the minimization. Indeed, for any foreseen reason, some of these positions may be discarded for the minimization. The specific way that the computing S50 is performed ensures that the predetermined knowledge of the fact that the geometric feature corresponds to the graphic feature is taken into account to determine the camera parameters in a relatively fast and simple way, said knowledge itself ensuring accuracy.

The method thus allows a fast determination of accurate camera parameters associated to the 2D view relative to the 3D representation. Said camera parameters may then be used for any application (e.g. known from the prior art) thereby improving accuracy of such application. For example, the method may further comprise determining a texture mapping between the 3D representation and the 2D view based on the computed camera parameters. In other words, the method determines information (i.e. the texture mapping) that allows texturing the 3D representation according to the graphic information (e.g. applying pixel information such as color information to the 3D model) contained in the 2D view, in a way that avoids shifts as presented with reference to FIG. 2, thanks to possessing information (i.e. the camera parameters) that translate accurately positions of the 2D view onto the 3D model.

An example of the method is now discussed with reference to FIGS. 6-11.

In this example, the method allows getting high quality textured 3D models by merging an RGB image with inaccurate pose (i.e. extrinsic camera parameters) and a 3D representation (i.e. 3D model). The algorithm consists in an optimization of the initial pose, based on an energy (i.e. distance) which is minimal when the 3D points of strong curvatures are projected onto the image on pixels of strong gradients. First, the method detects at S20 the visible 3D points of strong curvatures on the 3D model, and at S40 the pixels of strong gradients on the image. Then the method minimizes at S50 over the extrinsic parameters (which determine the pose of the camera) the sum of the squared distances between each selected 3D point projected onto the image and the nearest pixel among the selected pixels. The method of the example thus builds from the idea of having an approximate camera pose for the picture intended to texture the model.

Figure 6:
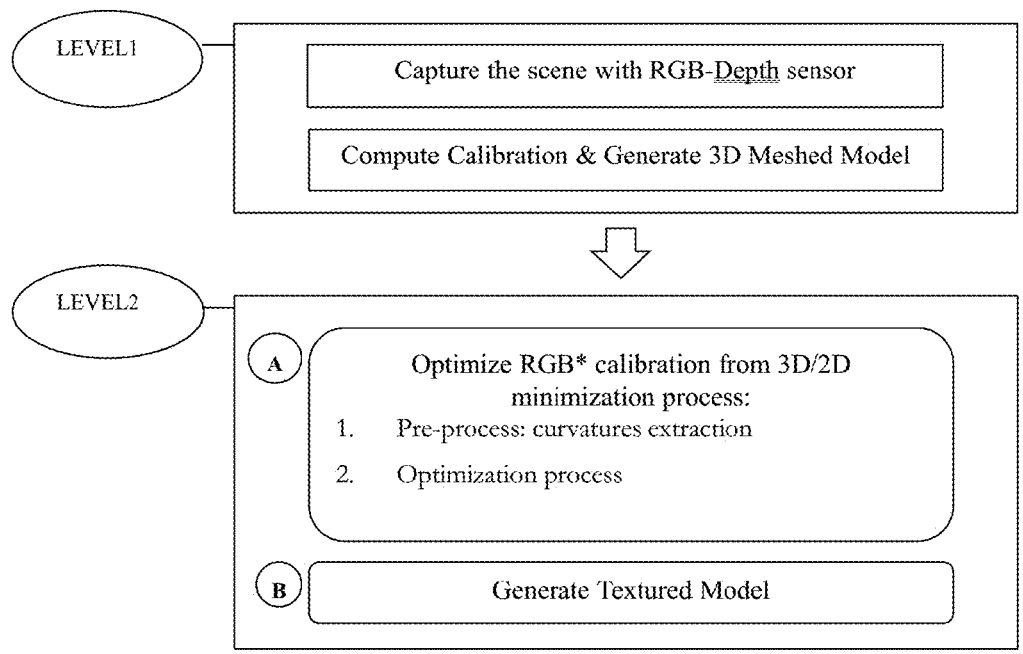
FIGS. 6-11 illustrate an example of the method.

FIG. 6 shows the global process overview of the example in two levels, with LEVEL 1 representing 3D reconstruction of a scene (containing at least one real object) and LEVEL 2 representing automatic texturing of the 3D model (i.e. 3D representation of the scene). FIG. 6 thus presents the two major levels of the global textured 3D reconstruction pipeline:

The first one consists in reconstructing the 3D scene with RGB or RGB-Depth sensors. RGB images can thus be extracted from RGB-D stream or from an external RGB sensor. An initial guess for extrinsic camera parameters is then provided with the 3D mesh model. These techniques are largely described in the literature, e.g. in the previously mentioned papers by Izadi et al, by Szeliski, and by Hartley, whose teaching regarding this specific aspect can be included to the method of the example.

The second level, at the heart of the method of the example, is dedicated to the RGB pose camera optimization for the texturing process. The proposed algorithm compares edges from the 3D model—as seen from the image—and coincides them to pixel zones of high gradients. The method of the example then defines an energy function related to the distance between projected 3D curvatures extracted on the mesh and 2D primitives on images (2D curvatures, i.e. images high gradients), and then minimizes iteratively this energy with gauss-Newton algorithm.

As will appear in the following discussion, compared to state of the art approaches, the presented solution allows the use of an un-calibrated RGB image to get a high quality textured 3D model. This optimization process is fast (in an example implemented by the inventors, about a few milliseconds for a High Definition image).

Figure 7:
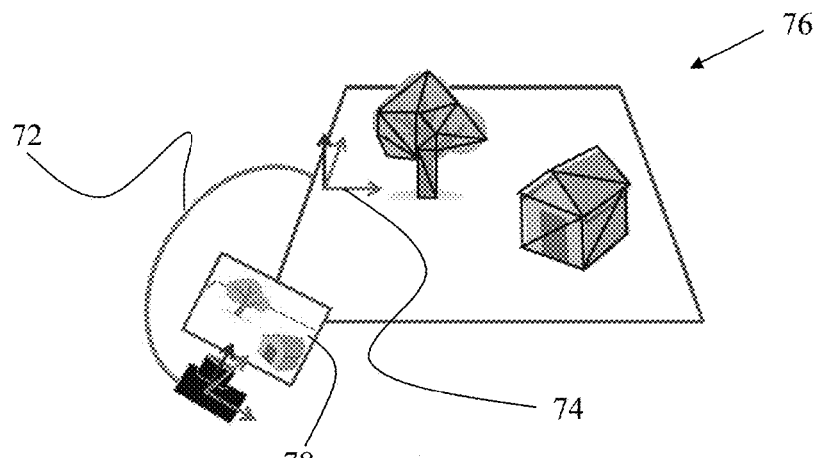

As already explained, the method of the example builds from the idea of having an approximate camera pose estimation. Pose camera in computer vision and in robotics is defined as the position of the camera in the scene. In the case of the method of the example, the rotation and the translation of the camera in the 3D reconstructed scene are contemplated (e.g. three angles for rotation and three coordinates for the translation vector). FIG. 7 illustrates the pose camera. FIG. 7 shows translation and rotation 72 of pose camera in the 3D representation 76 of a scene including a tree and a house that results in 2D view 78, based on 3D reconstructed scene referential 74.

Figure 8:
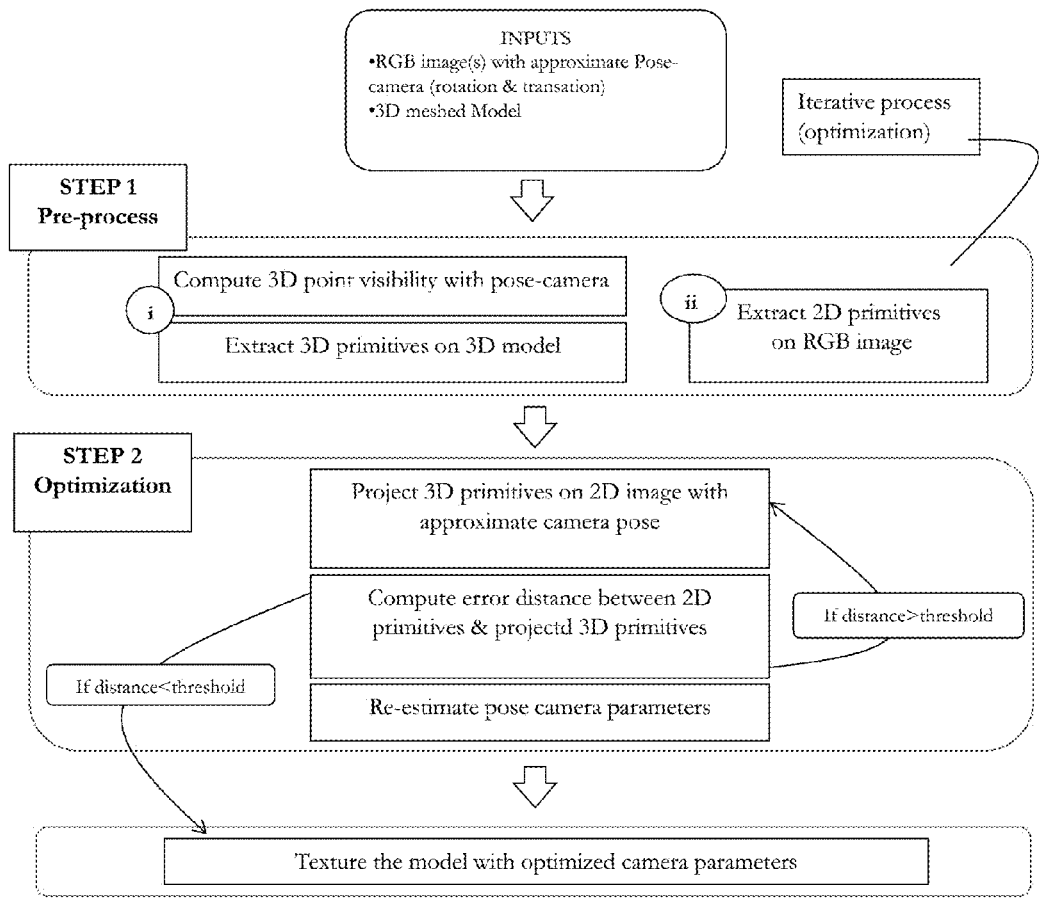

The following discussion focuses on the description of the image alignment process, which corresponds to LEVEL 2-A of FIG. 6 and is detailed in FIG. 8. The algorithm discussed below is divided into the following major steps:

---

1/Pre-process: robust curvatures extraction on the 2D image and the 3D model.
2/Optimization process:
   i. Update the pose by minimizing the sum of the distances (Gauss-Newton) between each selected 3D point projected onto the image and the nearest neighbor selected pixel.
   ii. Iterate steps 1/ and 2/until convergence criteria satisfaction.

---

The identifying S20 and S40 of the example are now discussed. This corresponds to STEP 1 of FIG. 8, that is, the pre-processing of robust curvature extraction on image and 3D model.

The 3D curvature extraction from a mesh at S20 is first discussed.

Figure 9:
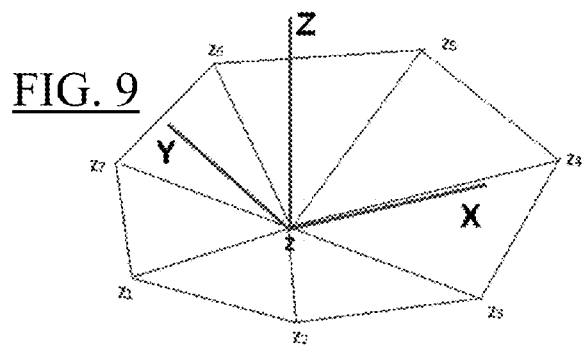

Referring to FIG. 9 which illustrates curvature estimation of a point on a triangular mesh, let x denote a 3D point on the mesh and $\{x1 \ldots xn\}$ its immediate neighbors, implying that for every point in $\{x1, \ldots, xn\}$ there exists an edge in the mesh leading to x. Let $\{y1 \ldots yn\}$ denote the x-translated set of neighbors, so that x becomes the origin. Let Z be the normal of the mesh at point x. If it does not yet exist, the method may average normal of neighboring triangles. The method may then assume an arbitrary direction X normal to Z and complete the orthonormal basis by $Y=Z^{\wedge}X$. We call $\{z, z1 \ldots zn\}$, the projected set $\{x, x1 \ldots xn\}$ in the new base. The surface within the set is then estimated by a least square fitting paraboloid, from which the method deduces a curvature and direction at point z estimation.

Following the orthogonal basis, we can describe the paraboloid with (a,b,c) so that:

$$z = ax^2 + bxy + cy^2$$

The least-square method on coefficients a, b and c yields:

$$(a, b, c) = \underset{a',b',c'}{\mathrm{argmin}} \sum_{i=1}^{n} (z_i(3) - (a' z_i(1)^2 + b' z_i(1) z_i(2) + c' z_i(2)^2))^2$$

Let X be the n*3 matrix whose row i equals to $(zi(1)^2, zi(1)zi(2), zi(2)^2)$ and J the n-sized vector $(zi(3))i$. Then the linear least-square solution is:

$$\begin{pmatrix} a \\ b \\ c \end{pmatrix} = (X^T X)^{-1} X^T J$$

As the surface of the example is regular, the principal curvatures are the Eigen values to the hessian matrix H. The mean curvature m is defined as the sum of the two principal curvatures, i.e. m=tr(H). The Gaussian curvature g being the product of the two principal curvatures, g=det(H).

$$\text{Since } H = \begin{pmatrix} 2a & b \\ b & 2c \end{pmatrix} = 2(a+c) \text{ and } g = 4ac - b^2.$$

Let c1 and c2 be the Eigen values of H at x. By definition m=c1+c2 and g=c1c2. Let $\Delta = m^2 - 4g$, and we get:

$$c1 = \frac{m + \sqrt{\Delta}}{2} \ etc2 = \frac{m - \sqrt{\Delta}}{2}$$

Obvious bounds to the surface curvature at x are [min(c1,c2); max(c1,c2)]. Therefore the curvature of highest value at x is approximated by max(|c1|, |c2|). The curvature at x may be considered to be equal to this value. 3D points x with a curvature of highest value above a predetermined threshold may then be selected.

The 2D curvatures extraction in the image at S40 is now discussed.

The identifying S40 of the example includes first applying a Gaussian blur on the 2D view. The Gaussian blur is a widely known filter that smoothens pixels of an image by averaging them with neighboring pixels. This prior smoothing improves correspondence to the geometric feature and therefore improves accuracy of the final result, for example by removing artifacts.

Then, to compute the 2D gradients in an image, the method may use the Sobel operator. The Sobel operator used two 3×3 kernels, $G_x$ and $G_y$, which are convolved with the image in order to compute the gradient for each pixel in both directions, x and y. We denote I the image.

For the Sobel operator:

$$G_x = \begin{pmatrix} 1 & 0 & -1 \\ 2 & 0 & -2 \\ 1 & 0 & -1 \end{pmatrix} G_y = \begin{pmatrix} 1 & 2 & 1 \\ 0 & 0 & 0 \\ -1 & -2 & -1 \end{pmatrix}$$

Then the method may compute the image of all the gradients in the x direction: gradIx=$G_x$*I, and in the y direction: gradIy=$G_y$*I, where * denotes the convolution.

Finally to extract the strongest edges on the image, the method just has to compute for each pixel the norm of the gradient (also called "curvature" in the following): G=(gradIx$^2$+gradIy$^2$)^(½), and then select the pixels whose G is above a specific predetermined threshold.

The computing S50 of the example is now discussed. This corresponds to STEP 2 of FIG. 8, that is, the pose camera optimization for texturing.

The method is to project image I onto a surface S with knowledge of camera intrinsic K (predetermined intrinsic parameters) and approximate camera pose P (previously determined approximate extrinsic parameters). The algorithm of the example iteratively updates P. In other words, the computing of camera parameters includes iteration of an optimization algorithm (which is itself iterative in the example, as illustrated later). This type of implementation allows reaching the result faster, as the iteration may be stopped when the method reaches convergence. Details of implementation are provided later.

For that, it is noted that the method of the example further comprises, prior to the computing S50 itself, filtering 3D positions of the 3D representation according to criteria evaluated according to a predetermined estimation of the camera parameters. In other words, among all 3D positions identified at S20, some positions are filtered, i.e. discarded, according to criteria that depend on the approximate knowledge provided by the current extrinsic parameters. This optimizes the method in terms of computing time and reached accuracy, by making efficient use of the available knowledge, even if it is approximate.

In specific, the criteria include visibility on the 2D view and/or distance of the projection with borders of the 2D view. The idea is that 3D points that are not visible on the 2D view, for example because of the perspective (i.e. 3D points that are obviously on a side of the real object not represented on the 2D view, according to the current approximation of the extrinsic parameters), are not required for the computation S50. Also, points which are to be projected close to the borders of the 2D view are believed to create artifacts in the optimization, such that discarding them for the computation S50 actually improves accuracy.

A way of doing so is to use a Z-Buffer (one could use OpenGL to that effect) in order to compute points of S visible in image I according to camera pose P. The method then filters points that are too close to the image border reprojection-wise. A further filtering may then occur for points for which the estimated curvature is lower than a given threshold, which actually consists in performing S20 at that time. Let {x1 . . . xs} be the remaining set of points.

In the example, the computing S50 is actually interlaced with the identifying S40. For that, the identifying S40 is iterated, with an increasing number of occurrences of the graphic feature at each iteration. The optimization algorithm is thus run after each such iteration. As already mentioned, this type of implementation makes the method faster. More precisely, working on relatively few occurrences of the graphic features makes one iteration of the method faster. However, until convergence is reached, there is room to improve accuracy of the computed camera parameters. Thus, additional occurrences of the graphic feature may be added, based on the principle that when there are more data, there should generally be higher precision.

Specifically, in the example the identifying S40 is iterated over resized versions of the 2D view. These versions are naturally ordered from the smallest to the largest. In other words, the level of details of the 2D view provided at S20 increases as the method is iterated, e.g. until convergence is reached. Of course, the case where there is no convergence may be handled in any way, e.g. by setting a limit in terms of number of loops or in terms of time.

The method thus computes a set of images I1, . . . , In, as following. I1 is the original image on which the method applied Gaussian blur. I2 is the original image resized by coefficient ½ on which the method applied Gaussian blur, and so on until In is the original image resized by coefficient 1/2n−1 and blurred. The method may be based on a predetermined n chosen so that In has less than 800 pixels.

The iterative optimization algorithm of the example uses t iterations per image, going upward from image In to image I1.

Let image Im be the running image and the current pose P=[R T] where R is the camera rotation matrix and T its translation vector. The method adjusts the intrinsic matrix K intro matrix K' to take into account the change of scale at image Im. This actually means to divide the intrinsic parameters by coefficient 2m−1. The rotation matrix R is uniquely associated with Euler angles α, β, γ that are easier to work with. One can easily switch from one representation to another.

So from image Im, the method selects all pixels p1, . . . , pr of curvature higher than an empiric threshold. Those pixels are then classified using a kd-tree structure A (which is, as known per se, a binary tree where each node divides the space so that each part contains an equal number of points). Such a nearest-neighbor structure makes it possible to find, for a given pixel, the nearest neighbor within the tree at a logarithmic cost (instead of linear).

Each point xi projected onto the running image is associated to the its nearest neighbor within A. Point xi is then associated with pixel pg(i).

The method then minimizes a sum of the square distances between projections of the retained 3D positions identified at S20 and their respective closest 2D positions among those identified at S40, i.e. function f:

$$f(tx', ty', tz', \alpha', \beta', \gamma') = \sum_{i=1}^{s} \|K'P(tx', ty', tz', \alpha', \beta', \gamma')x_i - p_{g(i)}\|^2$$

$$= \sum_{i=1}^{s} r_i(tx', ty', tz', \alpha', \beta', \gamma')^2$$

It is noted that alternatively, distance terms that are too high (e.g. above a predetermined threshold) may be discarded.

By minimizing f, the method aims to match points from S of high curvature to points of Im that have strong gradient within the image. The method does so by tweaking extrinsic parameters, meaning the camera pose. Here α', β', γ' are the tree angles corresponding to the camera extrinsic rotation, and tx', ty', tz' its translation vector. P denotes here the function computing the camera from those scalar values and K'P the function projecting a 3D point on the image.

The minimization criteria is thereby a non-linear least-squared, that may be solved through Gauss-Newton algorithm. In order to compute the gradient of each function $r_i$ used by the algorithm finite differences as an approximation. Of course one could refine that approximation for $r_i$. The finite differences yields gradient Ji. Let J be the matrix of size s*6 so that the row i be Ji, and Y the s-sized vector so that $Y(i)=-ri(tx,ty,tz,\alpha,\beta,\gamma)$ where tx,ty,tz,$\alpha,\beta,\gamma$ are the running pose extrinsic parameters. The Gauss-Newton algorithm yields:

$$\begin{pmatrix} dtx \\ dty \\ dtz \\ d\alpha \\ d\beta \\ d\gamma \end{pmatrix} = (J^T J)^{-1} J^T Y$$

The extrinsic parameters are updated using: xu=x+dtx, ..., $\gamma u=\gamma+d\gamma$. Thus another extrinsic matrix is computed Pu and serves as the new P matrix. A few run of the algorithm are computed on every image using that same logic. Once the final optimized pose is computed, the method simply projects the targeted texture in a classic fashion onto the mesh to finalize its purpose.

Figure 10:
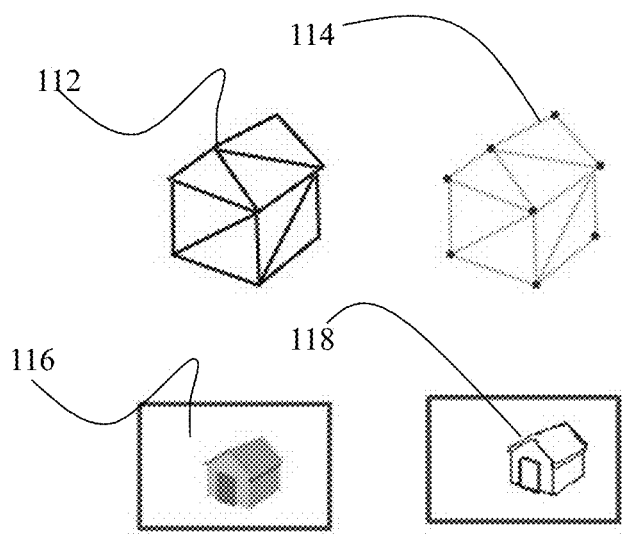
Figure 11:
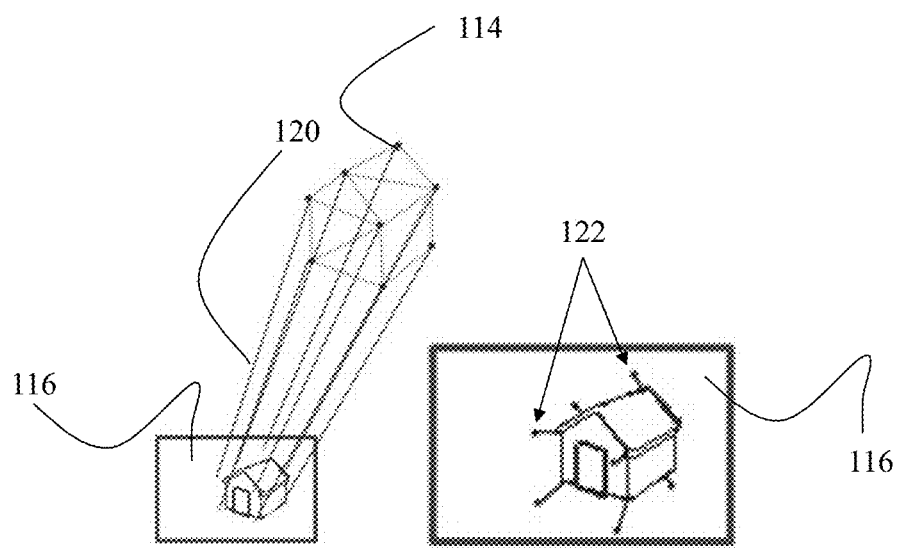

The global process is illustrated on FIGS. 10-11, which show the optimization process for accurate texturing description. FIG. 10 shows extraction 118 of 2D primitives on RGB Image 116 and extraction 114 of 3D primitives on 3D model 112. FIG. 11 shows how the method iterates the projection 120 of 3D primitives from extraction 114 on RGB image 116 (with new estimate of camera pose), resulting in projected points 122. This is iterated until satisfaction of predetermined error criteria.

From here, one might also want to take image distortion into account when projecting a 3D point onto the image to further improve accuracy. Another variation would be to include intrinsic parameters into the minimization, but that would result in a higher order of complexity for the Gauss-Newton algorithm.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method for designing a 3D modeled object representing a real object, comprising the steps of:
   providing a 3D representation of the real object;
   identifying occurrences of a geometric feature at 3D positions of the 3D representation, the geometric feature being a 3D curvature above a predetermined 3D curvature threshold;
   providing at least one 2D view of the real object, the 2D view being an image of the real object;
   identifying occurrences of a graphic feature at 2D positions of the 2D view, the geometric feature corresponding to the graphic feature, the graphic feature relating to pixel gradient;
   providing 3D positions at which occurrences of the geometric feature are identified, the 3D representation having a 3D curvature above the predetermined 3D curvature threshold at the 3D positions;
   providing 2D positions at which occurrences of the graphic feature are identified; and
   computing camera parameters that minimize a distance between a set of projections of the provided 3D positions on the 2D view and a set of 2D positions.

2. The method of claim 1, wherein the graphic feature is a pixel gradient above a predetermined threshold.

3. The method of claim 2, wherein the method further comprises determining a texture mapping between the 3D representation and the 2D view based on the computed camera parameters.

4. The method of claim 1, wherein the identifying of occurrences of the graphic feature includes first applying a Gaussian blur on the 2D view.

5. The method of claim 1, wherein the method further comprises, prior to the computing, filtering 3D positions of the 3D representation according to criteria evaluated according to a predetermined estimation of the camera parameters.

6. The method of claim 5, wherein the criteria include visibility on the 2D view and/or distance of the projection with borders of the 2D view.

7. The method of claim 6, wherein the identifying of occurrences of the graphic feature is iterated, with an increasing number of occurrences of the graphic feature at each iteration, and the computing of camera parameters includes an iterative optimization algorithm.

8. The method of claim 7, wherein the identifying of occurrences of the graphic feature is iterated over resized versions of the 2D view, that are ordered from the smallest to the largest.

9. The method of claim 1, wherein the intrinsic camera parameters are predetermined, the computed camera parameters thereby being the extrinsic camera parameters.

10. The method of claim 1, wherein providing the 3D representation of the real object comprises reconstructing the 3D representation from measurements of at least one depth sensor.

11. The method of claim 10, wherein the 2D view is an image captured by a high resolution camera and/or by a camera synchronous to the depth sensor.

12. A non-transitory computer readable storage medium comprising:
   a computer memory device having recorded thereon a computer program comprising instructions for execution by a computer, the computer when executing the instructions performs design of a 3D modeled object representing a real object by:
   providing a 3D representation of the real object;
   identifying occurrences of a geometric feature at 3D positions of the 3D representation, the geometric feature being a 3D curvature above a predetermined 3D curvature threshold;
   providing at least one 2D view of the real object, the 2D view being an image of the real object;
   identifying occurrences of a graphic feature at 2D positions of the 2D view, the geometric feature corresponding to the graphic feature, the graphic feature relating to pixel gradient;
   providing 3D positions at which occurrences of the geometric feature are identified, the 3D representation having a 3D curvature above the predetermined 3D curvature threshold at the 3D positions;

providing 2D positions at which occurrences of the graphic feature are identified; and computing camera parameters that minimize a distance between a set of projections of the provided 3D positions on the 2D view and a set of 2D positions.

13. A system comprising a processor coupled to a memory and a graphical user interface, the system being configured for the design of a 3D modeled object representing a real object by:

providing a 3D representation of the real object;

identifying occurrences of a geometric feature at 3D positions of the 3D representation, the geometric feature being a 3D curvature above a predetermined 3D curvature threshold;

providing at least one 2D view of the real object, the 2D view being an image of the real object;

identifying occurrences of a graphic feature at 2D positions of the 2D view, the geometric feature corresponding to the graphic feature, the graphic feature relating to pixel gradient;

providing 3D positions at which occurrences of the geometric feature are identified, the 3D representation having a 3D curvature above the predetermined 3D curvature threshold at the 3D positions;

providing 2D positions at which occurrences of the graphic feature are identified; and computing camera parameters that minimize a distance between a set of projections of the provided 3D positions on the 2D view and a set of 2D positions.

14. The system of claim 13, wherein the system further determines a texture mapping between the 3D representation and the 2D view based on the computed camera parameters.

15. The system of claim 13, wherein the identifying of occurrences of the graphic feature includes first applying a Gaussian blur on the 2D view.

16. The system of claim 13, wherein the system, prior to the computing, filters 3D positions of the 3D representation according to criteria evaluated according to a predetermined estimation of the camera parameters.

17. The system of claim 13, wherein the intrinsic camera parameters are predetermined, the computed camera parameters thereby being the extrinsic camera parameters.

18. The system of claim 13, wherein providing the 3D representation of the real object comprises reconstructing the 3D representation from measurements of at least one depth sensor, and wherein the 2D view is an image captured by a high resolution camera and/or by a camera synchronous to the depth sensor.

* * * * *

UNITED STATES PATENT AND TRADEMARK OFFICE
CERTIFICATE OF CORRECTION

PATENT NO. : 9,886,530 B2
APPLICATION NO. : 14/541860
DATED : February 6, 2018
INVENTOR(S) : Eloi Mehr, Vincent Guitteny and Mourad Boufarguine It is certified that error appears in the above-identified patent and that said Letters Patent is hereby corrected as shown below:

On the Title Page

In Item (71) Applicant, delete "Dassault Systemés" and insert --Dassault Systèmes--;

In Item (73) Assignee, delete "Dassault Systems" and insert --Dassault Systèmes--.

Signed and Sealed this
Eighth Day of May, 2018

Andrei Iancu
*Director of the United States Patent and Trademark Office*